United States Patent [19]

Koyama et al.

[11] Patent Number: 5,889,291
[45] Date of Patent: Mar. 30, 1999

[54] SEMICONDUCTOR INTEGRATED CIRCUIT

[75] Inventors: Jun Koyama; Yuji Kawasaki, both of Kanagawa, Japan

[73] Assignee: Semiconductor Energy Laboratory Co., Ltd., Kanagawa-ken, Japan

[21] Appl. No.: 688,829

[22] Filed: Jul. 31, 1996

Related U.S. Application Data

[63] Continuation of Ser. No. 423,085, Apr. 18, 1995, abandoned.

[30] Foreign Application Priority Data

Apr. 22, 1994  [JP]  Japan .................................. 6-107575

[51] Int. Cl.$^6$ .......................... H01L 29/04; H01L 31/036
[52] U.S. Cl. .................. 257/59; 257/57; 257/72; 257/349; 257/410
[58] Field of Search ................. 257/57, 59, 72, 257/349, 410; 359/59

[56] References Cited

U.S. PATENT DOCUMENTS

| | | | |
|---|---|---|---|
| 3,820,108 | 6/1974 | Luce | 350/332 |
| 4,409,724 | 10/1983 | Tasch, Jr. et al. | 29/571 |
| 4,470,060 | 9/1984 | Yamazaki | 357/41 |
| 4,693,770 | 9/1987 | Hatada | 156/151 |
| 4,838,654 | 6/1989 | Hamaguchi et al. | 359/59 |
| 5,063,378 | 11/1991 | Roach | 340/784 |
| 5,081,523 | 1/1992 | Frazier | 358/29 |
| 5,151,689 | 9/1992 | Kabuto et al. | 340/284 |
| 5,261,156 | 11/1993 | Mase et al. | 29/832 |
| 5,281,840 | 1/1994 | Sarma | 257/351 |
| 5,289,030 | 2/1994 | Yamazaki et al. | 297/410 |
| 5,308,998 | 5/1994 | Yamazaki et al. | 257/57 |
| 5,349,226 | 9/1994 | Kawaguchi et al. | 359/88 |
| 5,349,366 | 9/1994 | Yamazaki et al. | 359/59 |
| 5,402,041 | 3/1995 | Kishino et al. | 215/169.1 |
| 5,404,175 | 4/1995 | Nagae et al. | 359/51 |
| 5,412,240 | 5/1995 | Inoue et al. | 257/349 |
| 5,418,636 | 5/1995 | Kawasaki | 359/79 |
| 5,424,752 | 6/1995 | Yamazaki et al. | 345/92 |
| 5,426,526 | 6/1995 | Yamamoto et al. | 359/54 |

FOREIGN PATENT DOCUMENTS

| | | | |
|---|---|---|---|
| 0553775 | 8/1993 | European Pat. Off. | 257/72 |
| 0554063 | 8/1993 | European Pat. Off. | 257/72 |
| 53-144297 | 12/1978 | Japan . | |
| 61-004021 | 1/1986 | Japan . | |
| 5-114724 | 5/1993 | Japan | 257/59 |
| 5-249495 | 9/1993 | Japan | 359/59 |
| 6-82818 | 3/1994 | Japan | 359/59 |
| 6-250212 | 9/1994 | Japan | 359/59 |
| 6-250214 | 9/1994 | Japan | 359/59 |

*Primary Examiner*—Carl Whitehead, Jr.
*Attorney, Agent, or Firm*—Sixbey, Friedman, Leedom & Ferguson, PC; Gerald J. Ferguson, Jr.; Eric J. Robinson

[57] ABSTRACT

In a monolithic active matrix circuit that uses offset-gate TFTs in which the gate electrode is offset from the source and drain regions or TFTs whose gate insulating film is formed by vapor deposition, not only an active matrix circuit but also a drive circuit therefor is formed by using P-channel TFTs.

17 Claims, 8 Drawing Sheets

SEMICONDUCTOR INTEGRATED CIRCUIT

This application is a Continuation of Ser. No. 08/423,085, filed Apr. 18, 1995, now abandoned.

BACKGROUND OF THE INVENTION

The present invention relates to a semiconductor integrated circuit that is composed of thin-film semiconductor elements. The invention particularly relates to a monolithic active matrix devices, such as a liquid crystal display device and a dynamic RAM (DRAM), which have a matrix structure and in which an active matrix circuit including MOS or MIS (metal-insulator-semiconductor) field-effect elements (generally called MOS elements) that serve as switching elements for the matrix structure and a drive circuit for driving the active matrix circuit are formed on a single substrate. Further, the invention particularly relates to a device which uses thin-film transistors that are formed as MOS elements on an insulative surface at a relatively low temperature.

In recent years, in display devices having a matrix structure such as a liquid crystal display, studies have been made intensively of a matrix circuit (active matrix circuit) that uses thin-film transistors (TFT; insulated-gate semiconductor elements having thin-film active layers or regions) for switching of respective elements. In particular, a monolithic active matrix device in which not only an active matrix circuit but also peripheral circuits for driving it are formed on a single substrate using TFTs now attracts much attention. Since the monolithic active matrix device does not need connection of a large number of terminals, it is expected that the matrix density is increased and the production yield is improved.

To attain such purposes, it is necessary to use TFTs in which crystalline silicon is used for active layers, because the drive circuit is required to operate at very high speed.

To obtain such TFTs, the conventional semiconductor manufacturing technologies may be employed as they are, in which case, however, a substrate material should endure a high temperature of more than 900° C. However, such a material is limited to quarts glass, with which the substrate cost is very high when it is of a large area.

To use a less expensive substrate, the maximum temperature of a manufacturing process should be reduced to lower than 800° C., preferably lower than 600° C. Even where a manufacturer can afford to use an expensive substrate, it is in some cases necessary for a manufacturing process to be performed at lower temperatures due, to heat resistant performance of other materials constituting the circuits. In this case, active layers are formed by crystallizing amorphous silicon by, for instance, long-term thermal annealing at a temperature lower than 800° C., or optical annealing (laser annealing etc.) in which amorphous silicon is instantly crystallized by application of high-intensity light such as laser light. On the other hand, because thermal oxidation films as used in ordinary semiconductor processes cannot be used as a gate insulating film, a film of a silicon dioxide, silicon nitride, silicon oxy-nitride, or a like material is used that is formed at a temperature lower than 800° C. by vapor phase deposition such as plasma CVD, atmospheric pressure CVD, or sputtering.

On the other hand, TFTs using non-crystalline silicon such as polycrystalline silicon has a problem that a large drain current (leak current) flows when the gate electrode is reversely biased. It is known that this disadvantage can be much lessened by designing TFTs such that the gate electrode does not overlap with the drain (offset state). This type of transistor is called an offset-gate transistor. In the past, it was impossible to realize such an offset state with superior reproducibility by a photolithographic process. Japanese Unexamined Patent Publication Nos. Hei. 5-114724 and Hei. 5-267167 disclose solutions to this problem. That is, an offset can be formed by properly utilizing an increased gate portion obtained by anodic oxidation of the gate electrode.

Even if the offset gate is not intended, an anodic oxide film formed around the gate electrode provides an advantage of preventing hillocks in a subsequent heating process (for instance, a film deposition process by laser illumination or CVD), for instance, in the case where the gate electrode is formed by a material of insufficient heat resistance such as aluminum.

However, an insulative film formed by vapor deposition suffers from low film quality. Further, due to insufficient junction performance of the boundary between the surface of a silicon film and a gate insulating film, there occur many charge trap centers (particularly electron trap centers) at the boundary between the silicon film and the insulating film and in the insulating film. Therefore, when TFTs using such a material are used for a long time, many electrons are trapped by the trap centers, deteriorating characteristics of the TFTs.

Further, the anodic oxide film that is left for the offset formation similarly has many trap levels; in particular, an aluminum oxide film formed by anodic oxidation of aluminum likely traps electrons, This will deteriorate characteristics of TFTs when they are used for a long time.

Specifically in an N-channel TFT, a weak-P-type region that is formed at a boundary portion between the drain and the channel forming region by trapped electrons (see FIG. 7(A)) obstructs a drain current.

The formation of such a weak-P-type region is remarkable in an offset-gate TFT due to the following reason. In an actual operation, a weak-P-type region formed right under the gate electrode can be made smaller by voltage application to the gate electrode. However, because a weak-P-type region formed in the offset region is not much influenced by the gate electrode and is far away from the drain region, it is completely uncontrollable.

An anodic oxide film formed around the gate electrode has similar problems. In particular, when the drain voltage is low, an inversion layer (i.e., a channel) that should extend from the source to the drain is obstructed by a weak-P-type region. In addition, because of the low drain voltage, carriers (electrons because an N-channel TFT is now considered) moving through the channel-forming region has a low speed. Thus, the drain current is smaller than in the ordinary state (see FIG. 7(B)).

When the drain voltage is sufficiently high, the inversion layer itself retreats even in the normal state and electrons move at high speed. Therefore, the existence of a weak-P-type region is not a serious problem, but there can be obtained characteristics equivalent to those in the normal state.

The above-described phenomenon means a variation of the threshold voltage of an N-channel TFT. That is, the above-described N-channel TFT cannot be used for applications that require the threshold voltage to be stable, for instance, switching elements in an active matrix circuit or analog switch elements in peripheral drive circuits for the active matrix circuit.

In a P-channel TFT, in which trapped electrons simply adds a region having the same conductivity type as the drain in the channel region, there occurs no serious deterioration of characteristics.

Due to the above problems, a complementary (CMOS) circuit composed of N-channel TFTs and P-channel TFTs has a problem that it does not work properly after long-term usage because of deterioration of the N-channel TFTs. In a monolithic active matrix circuit, analog switches are needed at output ends of an active matrix circuit and a source driver. The above problems should be addressed in forming such analog switches. Further, in a monolithic active matrix circuit, a CMOS circuit is usually used in a logic circuit of peripheral drive circuits, as described in U.S. Pat. No. 4,582,395. The above-described problems of deterioration should be considered in forming such a monolithic active matrix circuit.

SUMMARY OF THE INVENTION

The present invention is intended to provide solutions to the difficult problems described above.

In particular, the above-described problems should be solved in the first place in a monolithic active matrix circuit, which is an integrated circuit having, on a single substrate, an active matrix circuit for performing image display by applying an analog electric field between opposed electrodes between which a material, such as a liquid crystal, whose transmittance or reflectance is varied by application of an electric field is inserted and peripheral circuits for driving the active matrix circuit.

According to a first aspect of the invention, all the transistors constituting a monolithic active matrix circuit are P-channel TFTs, and the TFTs constituting an active matrix circuit are of an offset-gate type. In particular, the offset-gate TFTs are produced by coating the gate electrodes with an anodic oxide film by subjecting those to the anodic oxidation as disclosed in Japanese Unexamined Patent Publication No. Hei. 5-114724 or Hei. 5-267167.

According to a second aspect of the invention, all the TFTs are P-channel TFTs in a monolithic active matrix circuit in which a gate insulating film is formed at a temperature not higher than 800° C.

According to a third aspect of the invention, all the transistors constituting a monolithic active matrix circuit are P-channel TFTs, and at least one of the TFTs constituting a drive circuit for an active matrix circuit is of an offset-gate type. In this case, as in the case of the first aspect, the offset TFTs may be formed by subjecting the gate electrodes to the anodic oxidation.

According to a fourth aspect of the invention, in a monolithic active matrix circuit, an anodic oxide film of a gate electrode is left on at least a side face of at least one of TFTs that constitute an active matrix circuit or a peripheral drive circuit therefor, and all the transistors of the monolithic active matrix circuit are P-channel TFTs.

A description will be made of the operation of the invention. It is natural to use offset-gate TFTs having an advantage of a small leak current as TFTs constituting an active matrix circuit which are required to have a high charge holding ability. However, if the offset-gate TFTs are used, the active matrix circuit is deteriorated because a weak-P-type region formed in an N-channel TFT cannot be controlled from the gate electrode or the drain region, as described above. This is fatal to devices, such as the active matrix circuit, that are expected to have Sufficient characteristics for analog switches. Even in the other circuits, the use of an N-channel TFT is not preferable in terms of deterioration.

As is understood from the above, it is necessary that all the TFTs be of a P-channel type in a monolithic active matrix circuit that uses offset-gate TFTs in an active matrix circuit (first aspect of the invention). With this configuration, superior circuit characteristics and high reliability have been obtained.

As described above, in a monolithic active matrix circuit, many electrons are trapped in a TFT using a gate insulating film that was formed at a temperature not higher than 800° C., so that characteristics of an N-channel TFT are greatly deteriorated. Therefore, it is necessary that all the TFTs be of a P-channel type in a monolithic active matrix circuit using TFTs that have a gate insulating film formed at a temperature not higher than 800° C. (second aspect of the invention). With this configuration, superior circuit characteristics and high reliability have been obtained.

It is natural to use offset-gate TFTs having an advantage of a small leak current as TFTs constituting a switching circuit of a peripheral drive circuit such as an analog buffer circuit which TFTs are required to have a high charge holding ability. However, if the offset-gate TFTs are used, the peripheral drive circuit is deteriorated because a weak-P-type region formed in an N-channel TFT cannot be controlled from the gate electrode or the drain region, as described above. This is fatal to devices, such as the analog buffer circuit, in which the stability of the threshold voltage is most necessary. Even in the other circuits, the use of an N-channel TFT is not preferable in terms of deterioration.

As is understood from the above, it is necessary that all the TFTs be of a P-channel type in a monolithic active matrix circuit that uses offset-gate TFTs in a peripheral drive circuit such as an analog buffer circuit (third aspect of the invention). With this configuration, superior circuit characteristics and high reliability have been obtained.

As described above, irrespective of an object of forming offset gates, coating gate electrodes with an anodic oxide film is very advantageous. However, the anodic oxide film likely traps charges. In particular, an anodic oxide film left on the side face of a gate electrode, which is close to a gate insulating film, likely traps electrodes and electrons trapped at such locations greatly affect the characteristics when TFTs are of an N-channel type. Therefore, it is necessary that all the TFTs be of a P-channel type in a monolithic active matrix circuit having TFTs in which an anodic oxide film is left on the side face of the gate electrode (fourth aspect of the invention). With this configuration, superior circuit characteristics and high reliability have been obtained.

DESCRIPTION OF THE PREFERRED EMBODIMENTS

Embodiment 1

Figure 5:
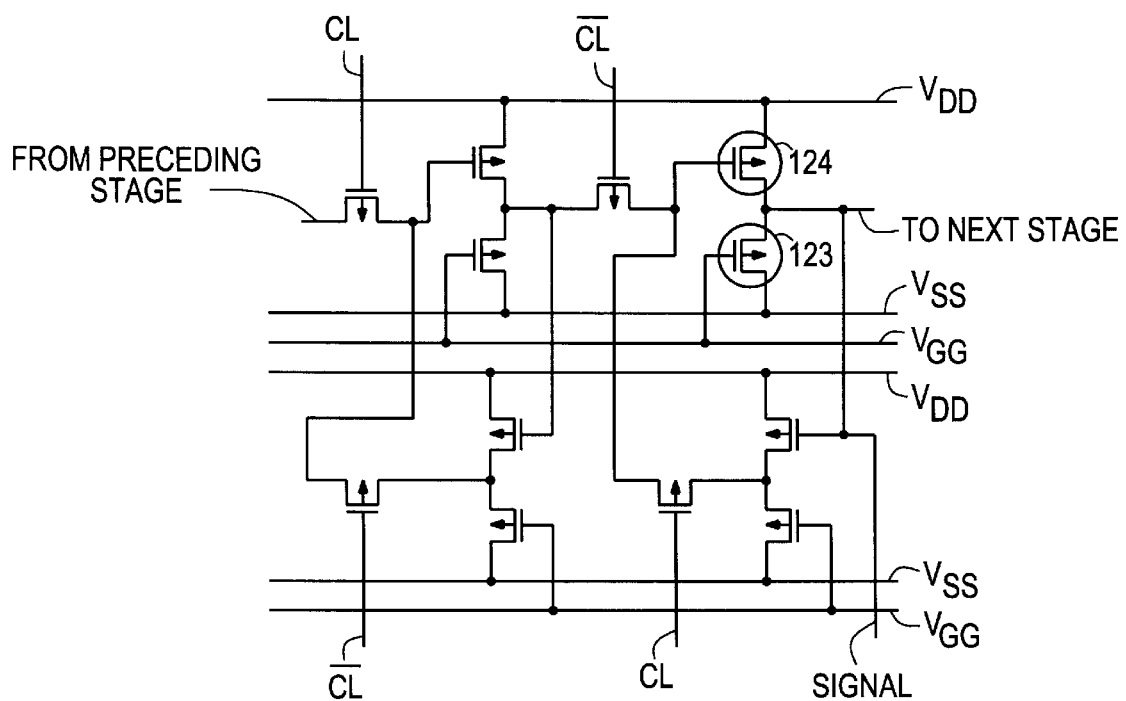
FIG. 5 circuit diagram showing a shift register used in an integrated circuit according to the first embodiment of the invention.
Figure 8:
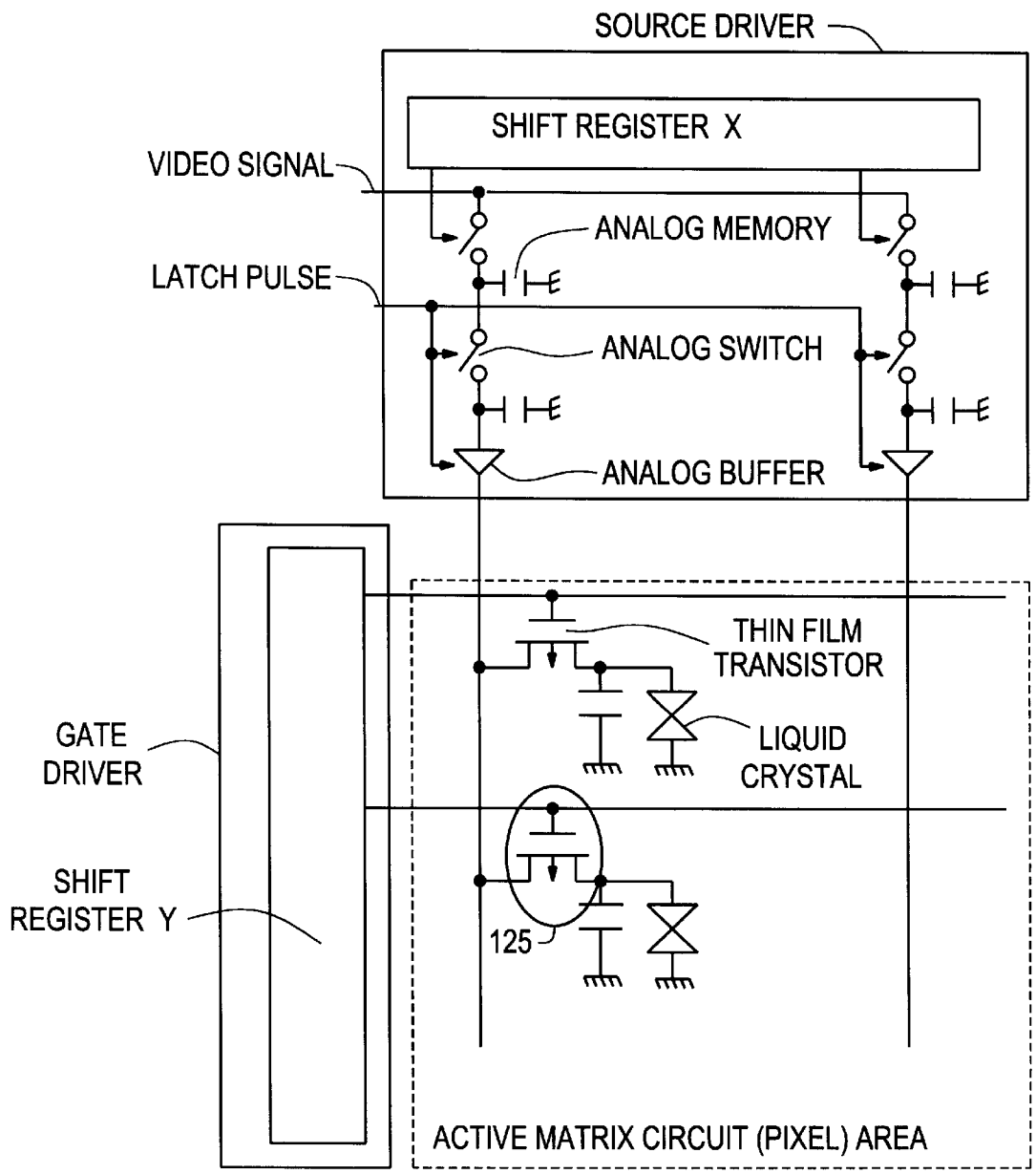
FIG. 8 is a block diagram showing a monolithic liquid crystal display according to the first embodiment of the invention.

A description will be made of an embodiment in which a monolithic liquid crystal display is produced according to the present invention. FIG. 8 is a block diagram showing a monolithic liquid crystal display according to this embodiment. All of TFTs used in component circuits of a liquid crystal display, i.e., a shift register X (for a source driver), a shift register Y (for a gate driver), analog switches of the source driver, and ether peripheral circuits and an active matrix circuit are of a P-channel type. FIG. 5 is a circuit diagram showing the shift register (one stage) of this embodiment.

This circuit requires three power lines $V_{DD}$, $V_{SS}$ and $V_{GG}$, where $V_{DD}>V_{SS}$. An optimum value of $V_{GG}$ is determined considering characteristics of the TFTs and, preferably, is approximately equal to or smaller than $V_{SS}$.

Referring to FIGS. 1(A)–1(E), a description will be made of a circuit manufacturing process of the above monolithic liquid crystal display. It is desirable that a substrate 101 be made of low-alkali glass or non-alkali glass such as Corning 7059 or NA35 or NA45 of NH Technoglass Corp. To prevent the substrate from contracting in heating steps in a TFT manufacturing process, it may be subjected to a proper heat treatment in advance. A silicon dioxide film 102 was formed as an undercoat film on the substrate 101 at a thickness of 1,000–5,000 Å, for example, 2,000 Å.

An amorphous silicon film was further deposited at a thickness of 300–1,500 Å, for instance, 500 Å, and crystallized by thermal annealing at 500°–600° C. This step may be performed by adding a very small quantity of a metal element, such as nickel, that facilitates the crystallization, to reduce the crystallization temperature, to thereby shorten the thermal annealing time. For example, when nickel was added by more than $1\times10^{18}$ atoms/cm$^3$, the crystallization was completed at 550° C. in 4–8 hours. After the crystallization step, crystallinity may be improved by irradiating laser light or equivalent high-intensity light.

In the crystallization step, naturally the crystallization may be effected by optical annealing in which the amorphous silicon film is irradiated with laser light or equivalent high-intensity light.

Then, island-like regions 103–105 were formed by etching the crystallized silicon film. The regions 103 and 104 are used for TFTs that constitute the peripheral drive circuits (source driver and gate driver), and the region 105 is used for a TFT that constitutes the active matrix circuit.

Subsequently, a silicon dioxide film 106 was deposited at a thickness of 1,000–1,500 Å, for instance, 1,200 Å by plasma CVD, and was made a gate insulating film. An aluminum film was deposited at a thickness of 3,000–8,000 Å, for instance, 5,000 Å by sputtering, and then etched into gate electrodes 107–109 (see FIG. 1(A)).

Then, anodic oxide films 110–112 were formed on the top and side faces of the respective gate electrodes 107–109 by applying a voltage in an electrolyte under the same conditions as described in Japanese Unexamined Patent Publication Nos. Hei. 5-114724 and Hei. 5-267167 (see FIG. 1(B)). The thickness of the anodic oxide films 110–112 was 1,500–3,000 Å, for instance, 2,000 Å. This thickness may be varied for various uses of TFTs, i.e., for TFTs used in the shift register, TFTs used in the analog buffer, TFTs used in the active matrix circuit, and TFTs for other circuits, because the thickness of the anodic oxide film is a factor of determining the width of the offset region as described in the publication No. Hei. 5-114724 and the TFT characteristics depend on the offset width.

After wiring lines connected to the gate electrodes 107–109 were cut when necessary, boron was doped through the entire surface by ion doping (also called plasma doping). A doping apparatus produced by Nissin Electric Co., Ltd. was used. The dose was $2\times10^{14}$ to $5\times10^{15}$ atoms/cm$^2$, for instance, $5\times10^{14}$ atoms/cm$^2$. The acceleration voltage was set at 30–80 kV, for instance, 65 kV, to implant ions into the silicon films 103–105 through the gate insulating film 106.

After the doping, doped boron was activated by irradiating the entire surface with laser light. A KrF or XeCl excimer laser was used with an energy density of 150–350 mJ/cm$^2$, for instance, 200 mJ/cm$^2$. It was possible to reduce the laser energy density by heating the substrate to 200°–400° C. Thus, P-type regions (sources and drains) 113–115 were formed in a self-aligned manner by implanting boron into the silicon regions 103–105 using the gate electrodes 107–109 and the anodic oxide films 110–112 as a mask (see FIG. 1(C)).

Then, a silicon dioxide film or a silicon nitride film 116 was deposited as an interlayer insulating film over the entire surface at a thickness of 3,000–8,000 Å, for instance, 5,000 Å. And a transparent conductive film, for instance, an indium tin oxide (ITO) film was deposited by sputtering at a thickness of 500–1,500 Å, for instance, 500 Å. A pixel electrode 117 was formed in the active matrix circuit area (pixel area) by etching the transparent conductive film (see FIG. 1(D)).

Figure 1A:
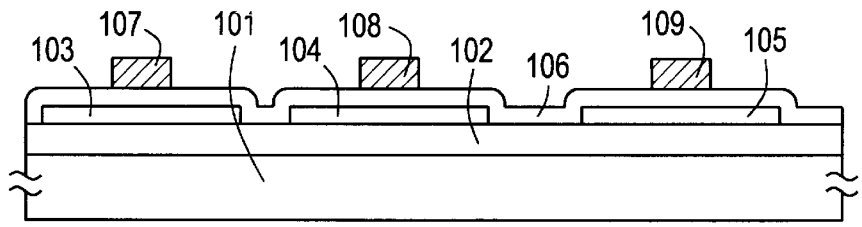
FIGS. 1(A)–(E) age sectional views schematically showing an integrated circuit manufacturing process according to a first embodiment of the present invention.
Figure 1B:
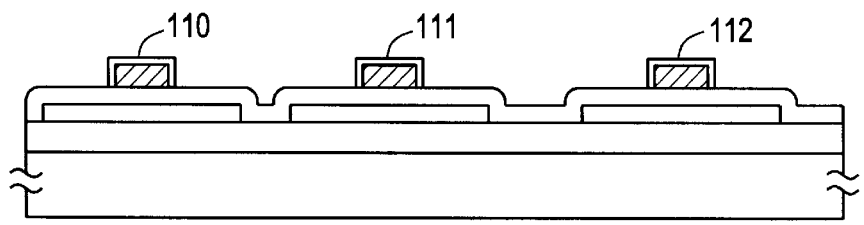
Figure 1C:
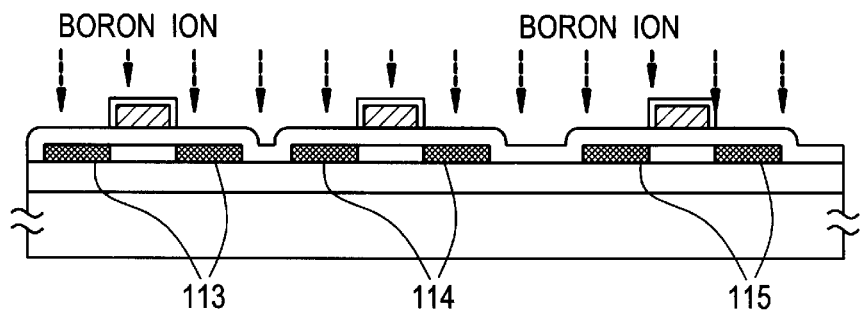
Figure 1D:
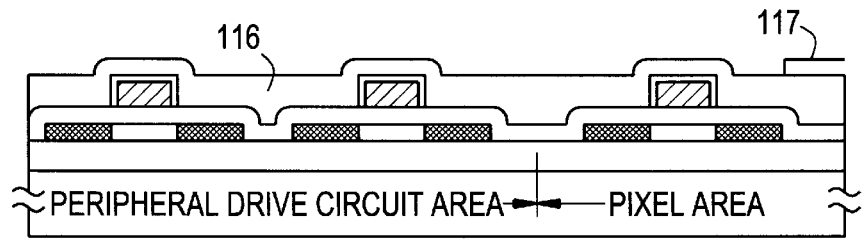
Figure 1E:
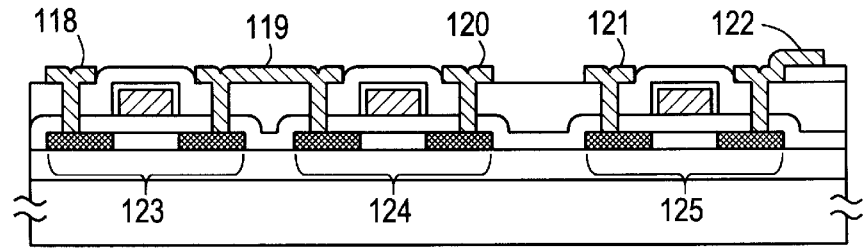

After contact holes for the sources and drains 113–115 of the respective TFTs and those (pot shown) for the gate electrodes 107–109 were formed, electrodes and wiring lines 118–122 were formed in the form of a multi-layer film of a titanium nitride film and an aluminum film (see FIG. 1(E)). In the above manner, TFTs 123 and 124 (see FIG. 5) were formed in the peripheral drive circuit area and a TFT 125 was formed in the pixel area (see FIG. 8). All of these TFTs are of a P-channel type.

Embodiment 2

Figure 6:
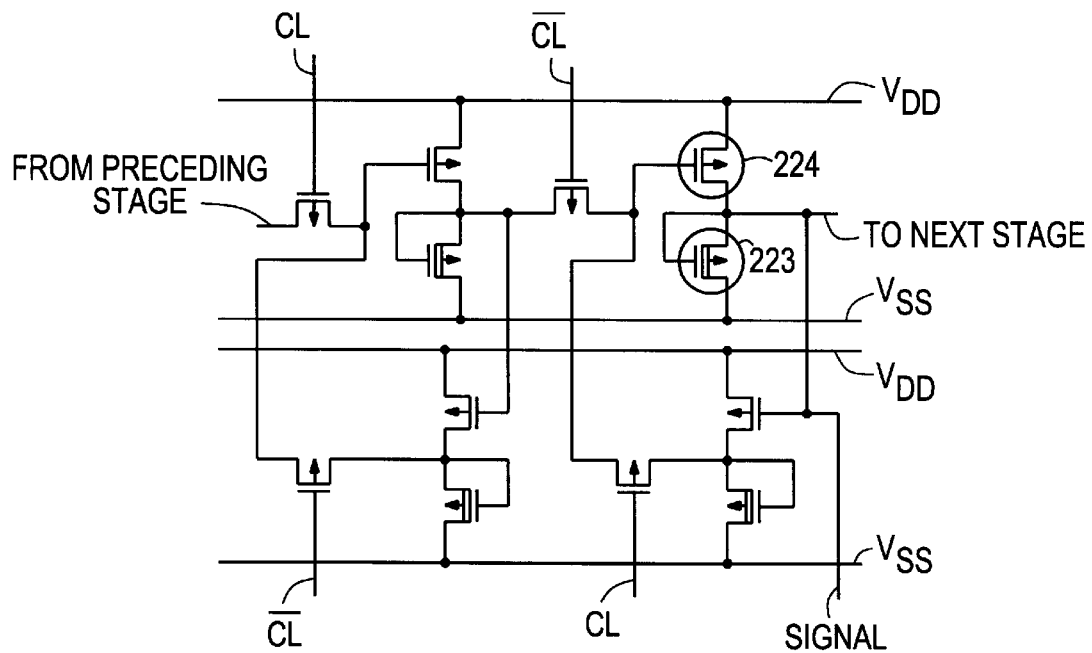
FIG. 6 is a circuit diagram showing a shift register used in an integrated circuit according to the second embodiment of the invention.
Figure 7A:
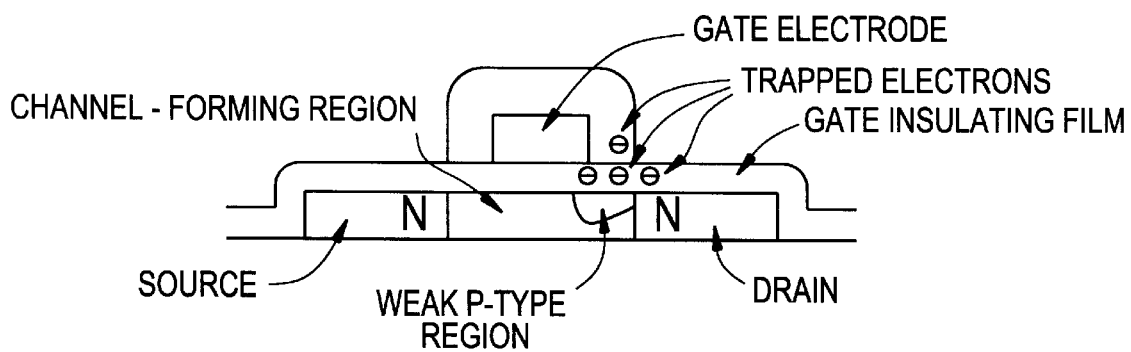
FIGS. 7(A) and 7(B) illustrate deteriorations of a conventional N-channel TFT.
Figure 7B:
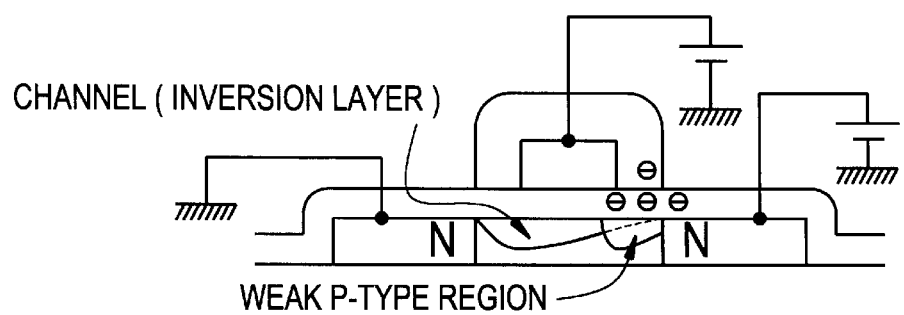

A description will be made of an embodiment in which another monolithic liquid crystal display is produced according to the invention. A block diagram of a monolithic liquid crystal display of this embodiment is the same as that of FIG. 8. FIG. 6 is a circuit diagram showing a shift register (one stage) of this embodiment. While all the TFTs are of a P-channel type, this embodiment has a feature that depletion type TFTs are used as loads in addition to enhancement type TFTs. In this circuit, only two power lines $V_{DD}$ and $V_{SS}$ are used; that is, the power line $V_{GG}$ of the first embodiment is not necessary. Therefore, this embodiment is preferable in terms of the circuit integration. The operation speed of this embodiment is generally faster than the first embodiment. The condition $V_{DD}>V_{SS}$ should also be satisfied in this embodiment.

Referring to FIGS. 2(A)–2(E), a circuit manufacturing process of the above monolithic liquid crystal display will be described. A substrate 201 made of non-alkali glass was used. A silicon dioxide film 202 was deposited as an undercoat film on the substrate 201 at a thickness of 1,000–5,000 Å, for instance, 2,000 Å.

Then, an amorphous silicon film 203 including a conductivity-imparting element such as boron or phosphorus at as low a concentration as possible was deposited at a thickness of 300–1,500 Å, for instance, 500 Å. A silicon dioxide film 204 was deposited thereon at a thickness of 1,000–3,000 Å, for instance, 2,000 Å, and was masked with a photoresist 205. The silicon dioxide film 204 was formed to prevent the surface of the amorphous silicon film from being roughened by implantation of boron ions.

Subsequently, boron was selectively introduced into the silicon film 203 by ion doping or ion implantation. In this embodiment, a weak-P-type region 206 was formed by introducing boron by ion doping in which the acceleration voltage was 65 kV and the dose was $1 \times 10^{13}$ to $2 \times 10^{14}$ atoms/cm$^2$ (see FIG. 2(A)). A depletion type TFT would be formed in this region.

After the photoresist mask 205 and the silicon dioxide film 204 were removed, the amorphous silicon film 202 was crystallized by thermal annealing or laser light irradiation.

The crystallized silicon film was then etched into island-like regions 207–209. The regions 207 and 208 are used for TFTs that constitute the peripheral drive circuits (source driver and gate driver), and the region 209 is used for a TFT that constitutes the active matrix circuit. The region 207 is used for a depletion type TFT, and the regions 208 and 209 are used for enhancement type TFTs.

Figure 2A:
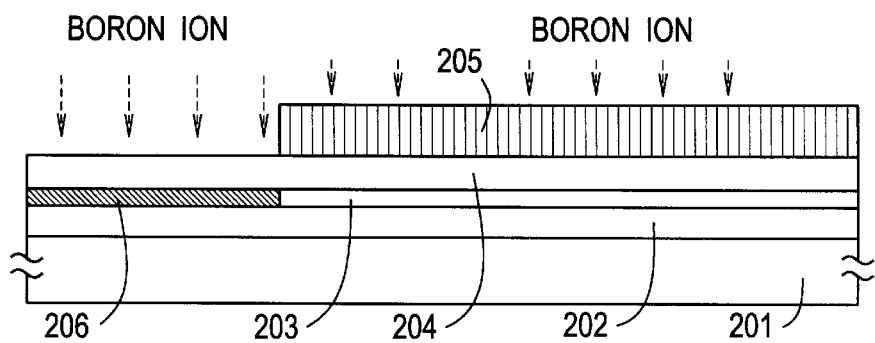
FIG. 2(A)–2(E) are sectional views schematically showing an integrated circuit manufacturing process according to a second embodiment of the invention.
Figure 2B:
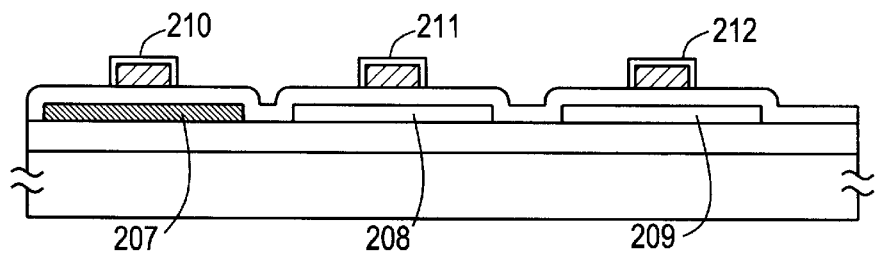
Figure 2C:
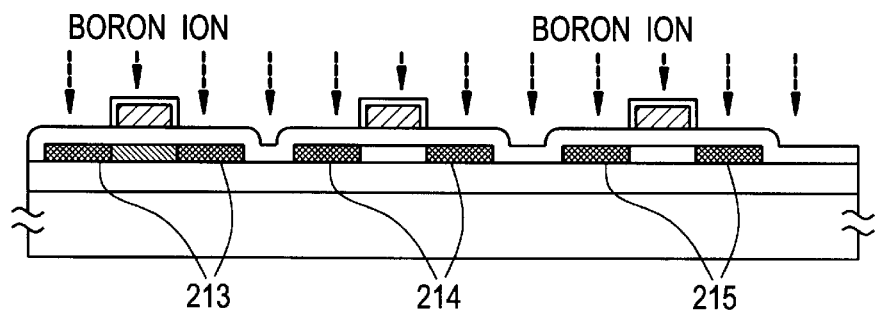
Figure 2D:
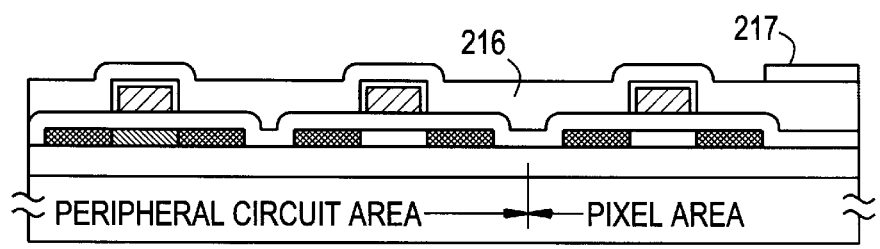

After a gate insulating film was deposited, gate electrodes 210–212 whose top and side faces were covered with an anodic oxide film were formed in the same manner as in the first embodiment (see FIG. 2(B)).

After wiring lines connected to the gate electrodes 210–212 were cut when necessary, boron was doped over the entire surface by ion doping. The dose was $5 \times 10^{14}$ atoms/cm$^2$. The acceleration voltage was set at 65 kV. After the doping, doped boron was activated by irradiating the entire surface with laser light. Thus, P-type regions (sources and drains) 213–215 were formed in a self-aligned manner by implanting boron into the silicon regions 207–209 using the gate electrodes 210–212 and the anodic oxide films as a mask (see FIG. 2(C)).

Then, a silicon dioxide film or a silicon nitride film 216 was deposited as an interlayer insulating film over the entire surface at a thickness of 5,000 Å. A pixel electrode 217 was formed in the active matrix circuit area (pixel area) by use of a transparent conductive film (see FIG. 2(D)).

Figure 2E:
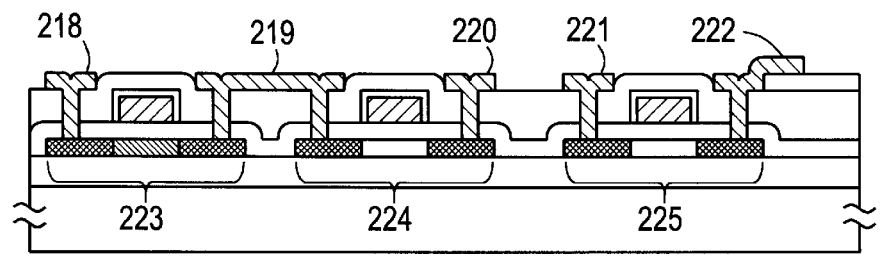

After contact holes for the sources and drains 213–215 of the respective TFTs and those (not shown) for the gate electrodes 210–212 were formed, electrodes and wiring lines 218–222 were formed in the form of a multi-layer film of a titanium nitride film and an aluminum film (see FIG. 2(E)). In the above manner, TFTs 223 and 224 (see FIG. 6) were formed in the peripheral drive circuit area and a TFT 225 was formed in the pixel area. All of these TFTs are of a P-channel type. The TFT 223 is a depletion type TFT having a weak-P-type channel-forming region. On the other hand, the TFTs 224 and 225 are enhancement type TFTs having an intrinsic or substantially intrinsic channel-forming region.

Embodiment 3

Figure 4:
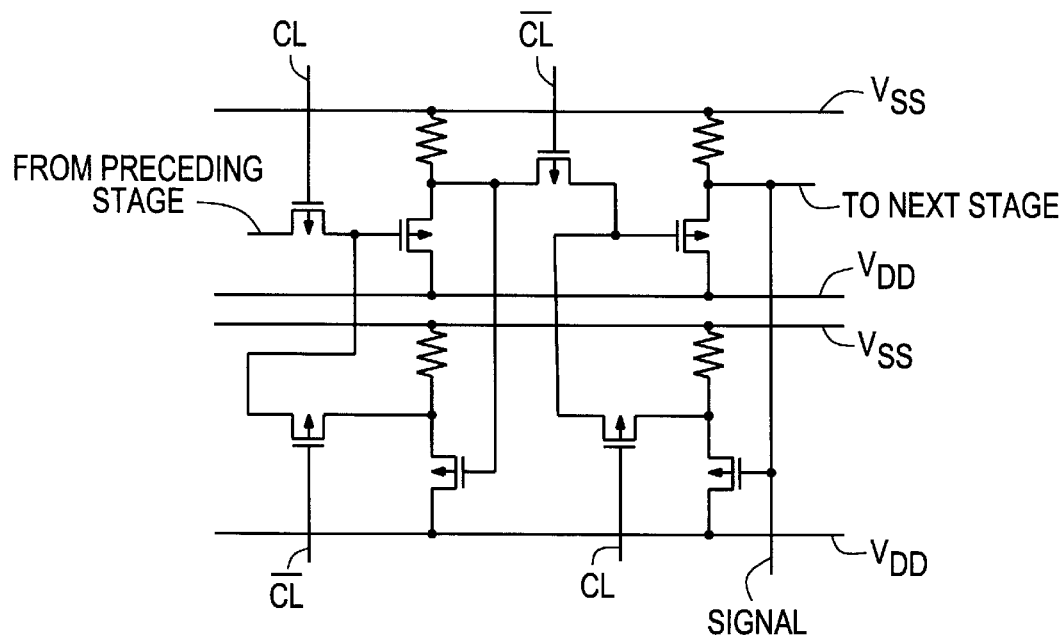
FIG. 4 is a circuit diagram showing a shift register used in an integrated circuit according to the third embodiment of the invention.

A description will be made of an embodiment in which another monolithic liquid crystal display is produced according to the invention. A block diagram of a monolithic liquid crystal display of this embodiment is the same as that of FIG. 8. FIG. 4 is a circuit diagram showing a shift register (one stage) of this embodiment. While all the TFTs are of a P-channel type, this embodiment has a feature that resistors are used as loads. In this circuit, only two power lines $V_{DD}$ and $V_{SS}$ are used as in the case of the second embodiment. The operation speed of this embodiment is generally faster than the first embodiment. The condition $V_{DD} > V_{SS}$ should also be satisfied in this embodiment.

Figure 3A:
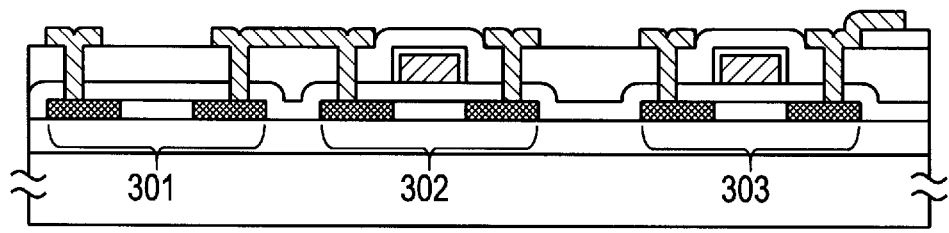
FIGS. 3(A)–3(C) are sectional views schematically showing integrated circuits according to a third embodiment of the invention.
Figure 3B:
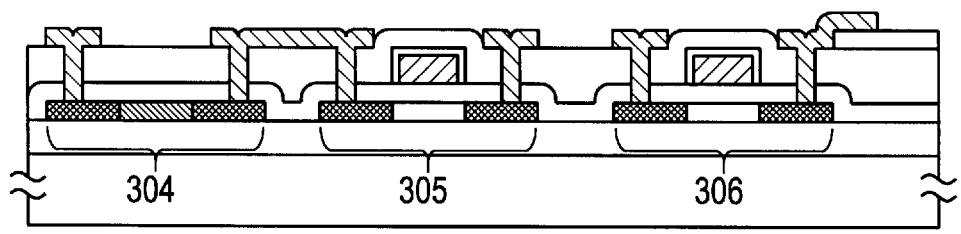
Figure 3C:
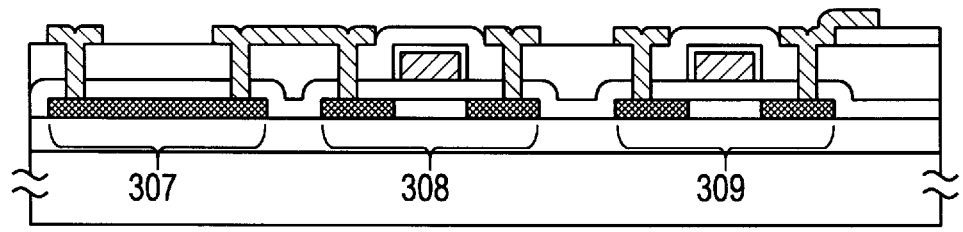

FIGS. 3(A)–3(C) are sectional views of the above-type of circuits, which are manufactured by using the integrated circuit manufacturing technologies as described in the first and second embodiments. Details of a manufacturing process are omitted here.

Referring to FIG. 3(A), a region 301 is a resistor, a region 302 is a TFT of the peripheral drive circuit, and a region 303 is a TFT of the pixel area. An intrinsic silicon region of the region 301 is used as a resistor. This type of resistor can be formed such that in the process of forming the TFT 123 of FIG. 1(E), the gate electrode 107 is removed after the doping for forming the source and drain 113 is performed. However, in this example, because intrinsic silicon is used as the resistor, the resistance value is generally large; usually more than 1MΩ. Therefore, this example has a problem of a low circuit response speed.

Referring to FIG. 3(B), a region 304 is a resistor, a region 305 is a TFT of the peripheral drive circuit, and a region 306 is a TFT of the pixel area. A weak-P-type silicon region of the region 304 is used as a resistor. This type of resistor can be formed such that in the process of forming the TFT 223 of FIG. 2(E), the gate electrode 210 is removed after the doping for forming the source and drain 213 is performed. In this example, because weak-P-type silicon is used as the resistor, the resistance value is usually about 100 kΩ.

Referring to FIG. 3(C), a region 307 is a resistor, a region 308 is a TFT of the peripheral drive circuit, and a region 309 is a TFT of the pixel area. A P-type silicon region of the region 307 is used as a resistor. This type of resistor can be formed such that in the process of forming the TFT 123 of FIG. 1(E), the gate electrode 107 is removed and then boron doping is performed. However, in this example, because P-type silicon is used as the resistor, the resistance is generally small; usually less than 10 kΩ. Therefore, this example has a problem of large power consumption.

The structure of FIG. 3(C) can be formed in the step of cutting the wiring lines connected to the gate electrodes between the step (for instance, the step of FIG. 1(B)) of forming the gate electrodes and performing the anodic oxidation and the boron doping step (FIG. 1(C)). However, to form the structures of FIGS. 3(A) and 3(B), one photo-lithographic process should be added to remove the gate electrode after the doping.

Embodiment 4

Figure 9:
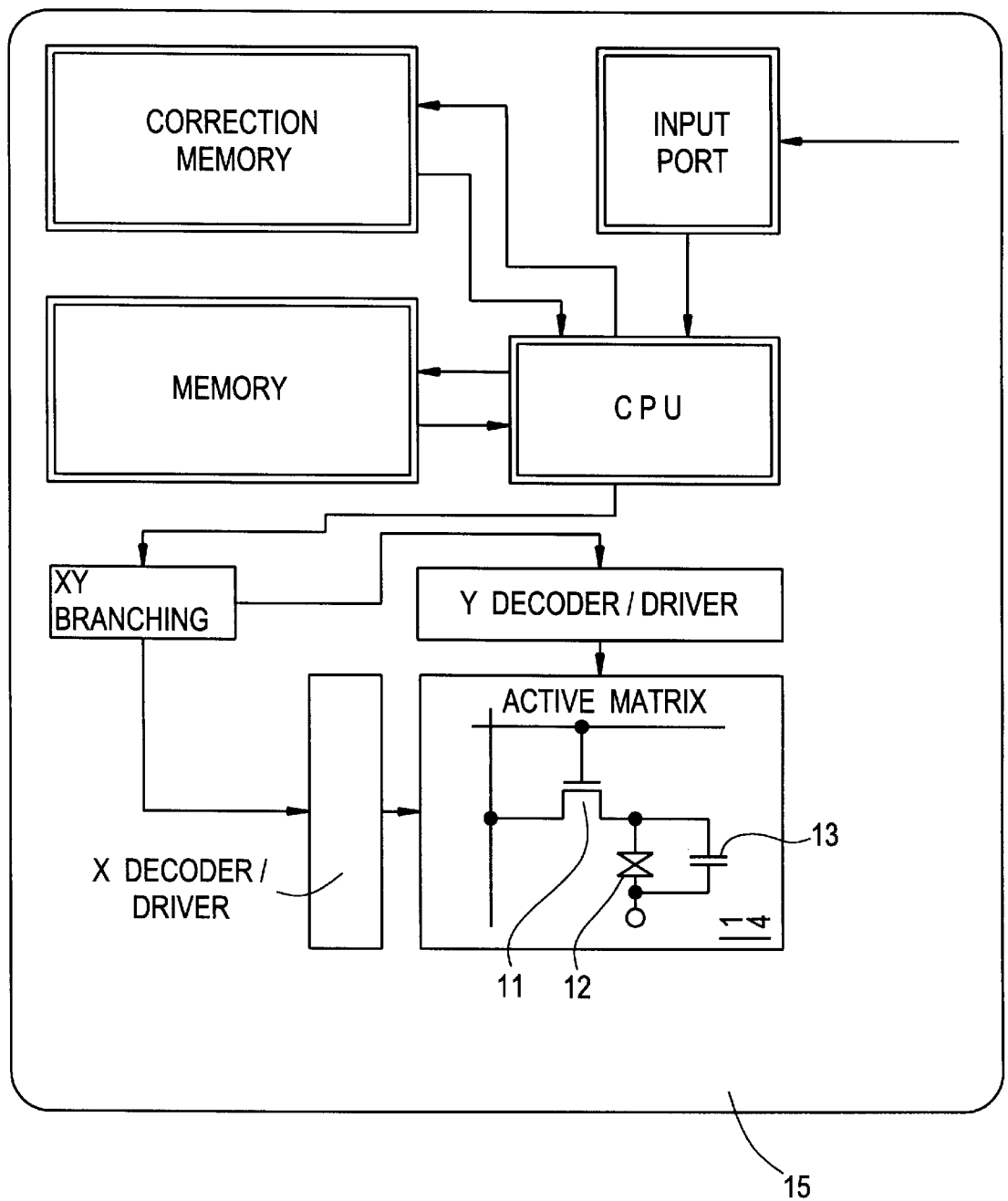
FIG. 9 is a block diagram showing a system according to a fourth embodiment the invention.

The first to third embodiments are directed only to the monolithic active matrix liquid crystal display. It is apparently possible to construct a more advanced system by using the active matrix liquid crystal display thus formed. FIG. 9 is a block diagram showing 4n example of such a system.

In the example of FIG. 9, the reduction in size, weight and thickness is attained by fixing semiconductor chips that are usually mounted on a computer main board on at least one of a pair of substrates of a liquid crystal display which substrates hold a liquid crystal. In particular, the above chips are fixed on the substrate having an active matrix circuit. The invention has a disadvantage that since P-channel TFTs is used in an active Matrix circuit and peripheral drive circuits, the power consumption is larger than in the case of using ordinary CMOS peripheral drive circuits. Therefore, in the system under discussion, the chips other than the liquid crystal display panel should use CMOS transistors, to reduce the power consumption. The substrate having the active matrix circuit uses the monolithic active matrix circuit of the invention.

A description will be made of the system of FIG. 9. A substrate 15 also serves as a substrate of a liquid crystal display. An active matrix circuit 14 having a large number of pixels each including a TFT 11, a pixel electrode 12 and an auxiliary capacitor 13, and an X decoder/driver, a Y decoder/driver and an XY branching circuit for driving the active matrix circuit are formed on the substrate 15 by using TFTs.

In this embodiment, other chips are additionally mounted on the substrate 15. These chips are connected to the circuits on the substrate 15 by wire bonding, a COG (chip one glass) method, or some other means. In FIG. 9, a correction memory, a memory, a CPU, and an input port are chips that are mounted in such a manner. Other various chips may be mounted on the substrate 15.

In FIG. 9, the input port is a circuit for reading an externally input signal. The correction memory is a memory for correcting an input signal etc. in accordance with the active matrix panel, and is therefore dedicated to the panel. More specifically, the correction memory is a nonvolatile memory that contains information specific to each pixel, and serves to effect correction for each pixel. Where a point defect exists at a certain pixel of an electro-optical device, signals corrected for the defective pixel are supplied to pixels adjacent thereto, to thereby compensate for the point defect and make it less discernible. Where a certain pixel is darker than adjacent pixels, a larger signal is supplied to that pixel to make its brightness equal to that of the adjacent pixels. Since the information on pixel defects is different from one panel to another, the information stored in the correction memory varies with the panel.

The CPU and the memory have the same functions as those used in ordinary computers. In particular, the memory has, as a RAM, an image memory corresponding to the pixels. All of these chips are of a CMOS type.

Figure 10A:
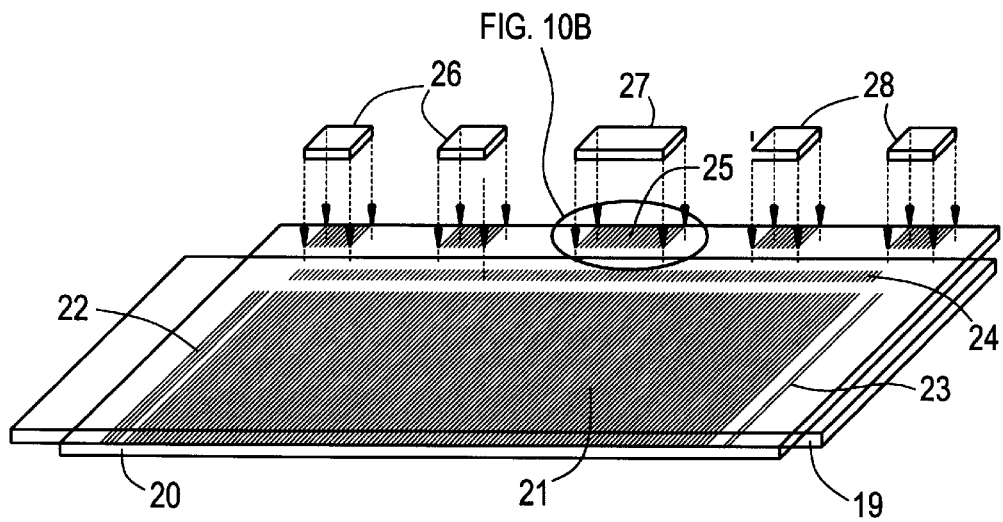
FIG. 10 shows specific configuration of the fourth embodiment.
Figure 10B:
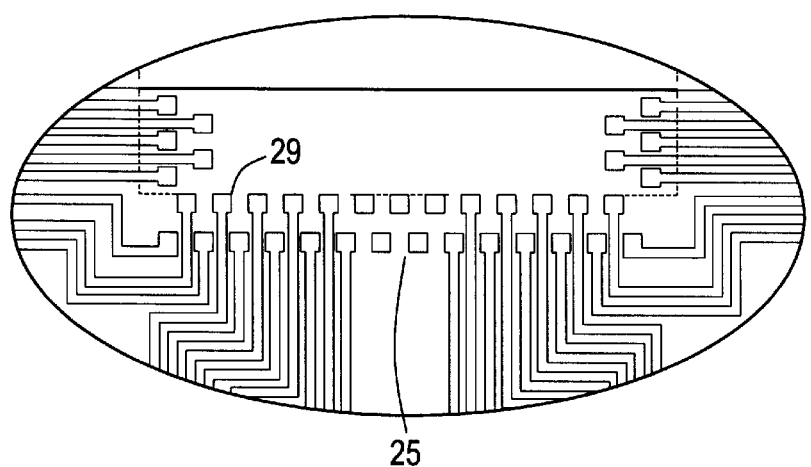

FIG. 10 shows an example of a specific configuration of this embodiment. Substrates 19 and 20 were opposed to each other, and a liquid crystal was interposed between those substrates. An active matrix circuit 21 and peripheral drive circuits 22–24 for driving it were formed on the substrate 20 by using TFTs. A main memory chip 26, an MPU (microprocessing unit) 27, a correction memory 28 were bonded to the surface on which the above circuits are formed, and these chips were connected to the circuits on the substrate 20. For example, when the chips were to be connected by a COG (chip on glass) method, wiring lines as denoted by 29 in FIG. 10 were formed in a fixing portion 25 on the substrate 20.

Figure 11:
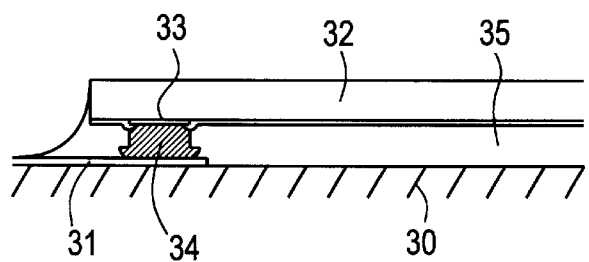
FIGS. 11 and 12 show examples of configurations obtained by a COG method in the fourth embodiment.
Figure 12:
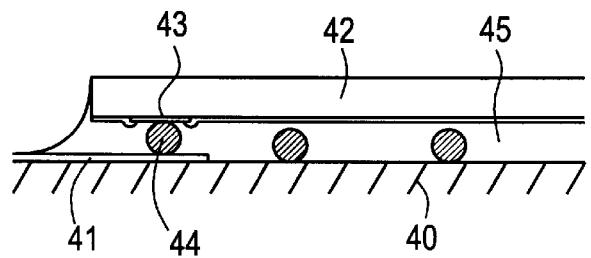

FIGS. 11 and 12 show specific shapes of contacts. In the method of FIG. 11, a conductive bump 34 provided at an electrode portion 33 of a chip 32 was brought into contact with a wiring line 31 on a substrate 30, and an organic resin 35 was introduced into a space between the chip 32 and the substrate 30 for fixing those to each other. The bump 34 may be made of gold formed by electroless plating.

In the method of FIG. 12, a chip 42 and a substrate 40 were bonded each other with an organic resin in which conductive particles (for example, gold particles) 44 were dispersed. The chip 42 was connected to the circuits by contacting an electrode portion 43 of the chip 42 and a wiring line 41 on the substrate to the conductive particles 44 existing therebetween. The organic resin used for the bonding was of an optical setting type, thermosetting type, or natural setting type. The liquid crystal may be injected into the liquid crystal display after the chip bonding.

Even the CPU and the memory were formed on the liquid crystal display substrate by the above process, so that an electronic device such as a simple personal computer could be constructed on a single substrate.

The chips may be connected to the circuits by a known wire bonding method.

The invention can improve the reliability of the monolithic active matrix circuit. Further, the invention can make the manufacturing process simpler than the process in the case of forming an ordinary CMOS circuit. For example, a photolithographic step for doping a different kind of impurities and a step of implanting N-type impurities, which are necessary in forming a CMOS circuit, are eliminated in the first embodiment.

The second embodiment needs the same number of steps as in the case of forming an ordinary CMOS circuit, because a photolithographic step and a doping step are needed to form the weak-P-type region. However, where a photoresist or the like is used as a doping mask and ions are doped at a high dose, a long-term ashing step is usually needed because of difficulty in removing the carbonized photoresist. In contrast, in the second embodiment, the dose itself is low and the photoresist 205 can be removed by a lift-off method by etching the silicon dioxide film 204 (see FIG. 2(A)). Therefore, the photoresist mask can be removed more easily after the doping than in the process of forming an ordinary CMOS circuit.

As described above, the invention is useful from the industrial point of view.

What is claimed is:

1. A semiconductor integrated circuit comprising:

an insulating substrate;

an active matrix circuit formed on said substrate, said active matrix circuit including first thin-film transistors;

a drive circuit formed on said substrate for driving said active matrix circuit, said drive circuit including second thin-film transistors;

a counter substrate opposed to said insulating substrate with a liquid crystal interposed therebetween, wherein said counter substrate covers said active matrix circuit and said drive circuit while a portion of the insulating substrate extends beyond at least one side edge of the counter substrate:

at least one semiconductor chip on the portion of said insulating substrate extending beyond said side edge of the counter substrate, and operatively connected to said drive circuit;

wherein all of said first thin film transistors are of p-channel type, and wherein each of said first thin film transistors comprises a gate electrode coated with an anodic oxide film.

2. The circuit of claim 1 wherein said first transistors are of an offset-gate type that a gate electrode is apart from a drain region.

3. The circuit of claim 1 wherein said first thin film transistors are crystalline thin film transistors.

4. The circuit of claim 1 wherein all of said second transistors are of p-channel type in order to prevent variation of threshold voltages of said second transistors, said variation being originated from electrons trapped in said transistors.

5. The circuit of claim 4 wherein at least one of said second transistors is of an offset-gate type that a gate electrode is apart from a drain.

6. The circuit of claim 5 wherein said one of said second transistors is an analog buffer circuit.

7. The circuit of claim 1 wherein all of said first thin film transistors are of p-channel type in order to prevent variation of threshold voltages of said first transistors, said variation being originated from electrons trapped in gate insulating films of said transistors.

8. The circuit of claim 7 wherein said gate insulating films are formed at a temperature not higher than 800° C.

9. A semiconductor integrated circuit comprising:

an insulating substrate;

an active matrix circuit formed on said insulating substrate, said active matrix circuit including first crystalline thin-film transistors;

a drive circuit formed on said insulating substrate for driving said active matrix circuit, said drive circuit including second thin-film transistors;

a counter substrate opposed to said insulating substrate with a liquid crystal interposed therebetween, wherein said counter substrate covers said active matrix circuit and said drive circuit while a portion of the insulating substrate extends beyond at least one side edge of the counter substrate;

at least one semiconductor chip on the portion of said insulating substrate extending beyond said side edge of the counter substrate, and operatively connected to said drive circuit;

wherein all of said first crystalline thin film transistors are of p-channel type.

10. The circuit of claim 9 wherein said each of said first thin film transistors comprise a gate electrode coated with an anodic oxide film.

11. The circuit of claim 9 wherein said each of said first thin film transistors are of an offset-gate type that a gate electrode is apart from a drain region.

12. A semiconductor integrated circuit comprising:

an insulating substrate;

an active matrix circuit formed on said insulating substrate, said active matrix circuit including first thin-film transistors;

a drive circuit formed on said insulating substrate for driving said active matrix circuit, said drive circuit including an analog buffer circuit comprising second thin-film transistors;

a counter substrate opposed to said insulating substrate with a liquid crystal interposed therebetween wherein said counter substrate covers said active matrix circuit and said drive circuit while a portion of the insulating substrate extends beyond at least one side edge of the counter substrate;

at least one semiconductor chip on the portion of said insulating substrate extending beyond said side edge of the counter substrate, and operatively connected to said drive circuit, wherein all of said first thin film transistors are of p-channel type.

13. The semiconductor integrated circuit of claim 12 wherein said semiconductor chip comprises CMOS devices.

14. The semiconductor integrated circuit of claim 12 wherein said first thin film transistors are of an offset-gate type.

15. The semiconductor integrated circuit of claim 11 wherein said semiconductor chip is mounted over wiring lines on said insulating substrate.

16. The semiconductor integrated circuit of claim 9 wherein said semiconductor chip is mounted over wiring lines on said insulating substrate.

17. The semiconductor integrated circuit of claim 12 wherein said semiconductor chip is mounted over wiring lines on said insulating substrate.

* * * * *